United States Patent [19]

Howard

[11] 3,761,800

[45] Sept. 25, 1973

[54] INTEGRAL CYCLE THYRISTOR POWER CONTROLLER

[75] Inventor: Patrick Joseph Howard, Bound Brook, N.J.

[73] Assignee: RCA Corporation, New York, N.Y.

[22] Filed: Feb. 2, 1972

[21] Appl. No.: 222,784

[52] U.S. Cl. .................... 323/18, 307/133, 323/19, 323/24, 323/39, 323/40

[51] Int. Cl. .................... G05d 23/24

[58] Field of Search ............ 307/133, 252 B, 252 N, 307/252 UA; 323/16, 18, 19, 24, 36, 38, 39, 40

[56] References Cited

UNITED STATES PATENTS

| | | | |
|---|---|---|---|
| 3,579,096 | 5/1971 | Buchanan | 323/24 X |
| 3,329,887 | 7/1967 | Schaeve | 323/24 X |
| 3,486,042 | 12/1969 | Watrous | 307/252 UA |

OTHER PUBLICATIONS

RCA Transistor, Thyristor, & Diode Manual, Technical Series SC-15, April 1971, Pages 218-221, TK 7871.85R3.

*Primary Examiner*—A. D. Pellinen
*Attorney*—Edward J. Norton et al.

[57] ABSTRACT

"Half cycling" is the tendency of a thyristor to conduct only during half cycles of the applied alternating current operating voltage and it can occur when the control circuit for the thyristor is in an indeterminate state. In the present circuit such operation is prevented by sensing the rate of change of current flow through the thyristor and using the control signal thereby obtained to operate the control circuit when the control circuit tends to be in an indeterminate state.

11 Claims, 6 Drawing Figures

INTEGRAL CYCLE THYRISTOR POWER CONTROLLER

This invention relates to thyristor switching circuits and, more particularly, to synchronously switched thyristor switching circuits utilizing zero-voltage switching means for providing a triggering signal to a gate electrode of a thyristor.

The triac or bidirectional triode thyristor is a three terminal solid-state switch which is normally triggered into conduction by the application of a pulse to its gate electrode in the presence of an applied bias to its main terminal electrodes; the direction of current conduction through the device being dependent upon the polarity of the applied bias signal.

One of the problems encountered in the application of thyristor switching circuits is to design the circuit such that it will switch on and off at times which correspond to the minimum values of the alternating current supply so as to avoid the generation of switching transients and the electrical interference associated therewith. In many instances such synchronous operation can be accomplished by using a zero-voltage switch such as, for example, the RCA CA3059 IC zero-voltage switch. Such switches trigger the thyristor by means of a gate pulse synchronized with the zero-voltage or zero-current crossing of the load. One of the problems associated with the use of zero-voltage switches is a phenomenon known as "half-cycling" which results in an unsymmetrical supply of ac half cycles to the load (i.e. an unequal number of positive and negative half cycles). This result is undesirable as it introduces a dc component on the power line.

A switching circuit for controlling the supply of power to a load from an alternating current (ac) source in accordance with the present invention comprises a thyristor having first and second main electrodes and a gate electrode; switching means including a comparison circuit having a pulse-ensuring terminal and a pulse-inhibiting terminal, said switching means being adapted, under normal operation, to provide a triggering signal to the gate electrode of said thyristor when the potential at said pulse-ensuring terminal substantially exceeds the potential of said pulse-inhibiting terminal, and to prevent the provision of such signal when the potential at said pulse-inhibiting terminal substantially exceeds the potential at said pulse-ensuring terminal, the operation of said switching means being unstable during periods when the potential at said pulse-ensuring and pulse-inhibiting terminals are approximately equal, said instability resulting in the unsymmetrical supply of ac half-cycles to the load during such periods; and means responsive to the conduction state of said thyristor during a given half-cycle of ac operation for providing a signal to one of said terminals, said signal operating during such periods of unstable operation to permit to prevent the application of a triggering signal to the gate electrode of said thyristor during the subsequent half-cycle of applied ac thereby causing said thyristor to conduct for an integral number of ac cycles during such periods.

The present invention will be more readily understood upon reading the specification hereof in conjunction with the accompanying drawing wherein.

Figure 1:
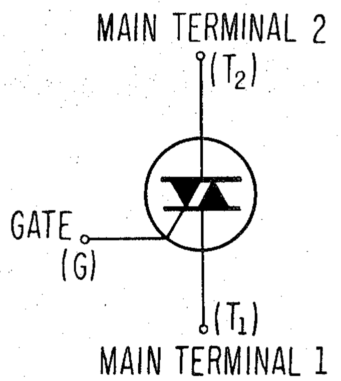
FIG. 1 is a schematic diagram of a triac as used in this application.

Referring first to FIG. 1, it will be seen that a triac is a three terminal solid-state switch having a first main terminal electrode designated $T_1$, a second main terminal electrode designated $T_2$, and a gate electrode designated G. The triac is bidirectional, dependent upon the polarity of potential applied across its main terminal electrodes, and can be triggered into conduction in any of four operating modes as summarized below (all polarities taken with terminal $T_1$ as the point of reference potential):

| Operating Quadrant | $V_G$ | $V_{T_2}$ |
|---|---|---|
| I(+) | positive | positive |
| I(−) | negative | positive |
| III(+) | positive | negative |
| III(−) | negative | negative |

The gate-trigger requirements of the triac are different in each of the operating quadrants, generally being most sensitive in the I(+) and III(−) modes.

The RCA–CA3059 zero-voltage switch is a monolithic integrated circuit useable as a triger circuit for the control of thyristors. The multistage circuit embodies a diode limiter, a threshold detector, an on/off sensing amplifier, and a Darlington output drive to provide the basic switching action. The DC supply voltage for these stages is provided by an internal Zener-diode regulated power supply that has sufficient current capability to drive external circuit elements such as transistors and other integrated circuits. An important feature of the CA3059 is that the trigger pulses developed by this circuit can be applied directly to the gate of a thyristor such as a triac. A built-in fail-safe circuit inhibits the application of these pulses to the thyristor gate circuit in the event the external sensor for the integrated circuit switch should be inadvertently opened or shorted. A detailed explanation of the operation of the CA3059, along with suggested applications, appears in RCA application notes ICAN 4158 (published March, 1970), ICAN 6158 (published May, 1971), and ICAN 6268 (published June, 1970).

Operation of the CA3059 zero-voltage switch can best be explained by reference to the functional block diagram shown in FIG. 2 and the circuit schematic shown in FIG. 3. For purpose of illustration, the present invention is described within the context of a temperature controlling circuit, an application for which the CA3059 is particularly well adapted, and all voltages are referenced to terminal 7 of the zero-voltage switch.

Figure 2:
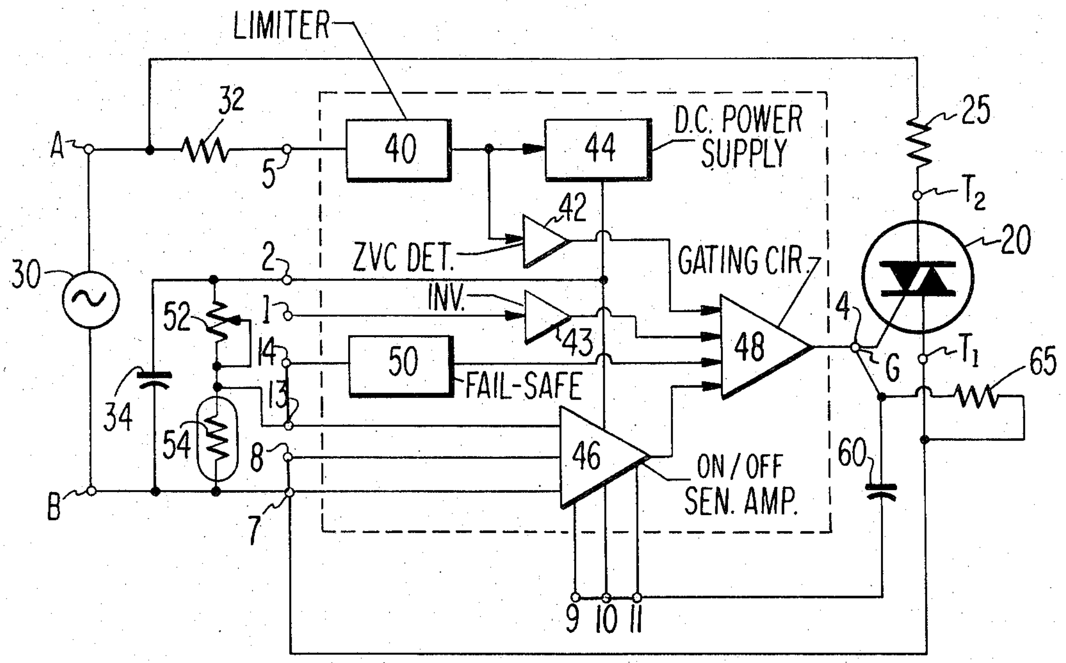
FIG. 2 is a functional block diagram of a switching circuit in accordance with the present invention which embodies an RCA–CA3059 integrated circuit zero-voltage switch.

With reference to FIG. 2, the main terminal electrodes $T_1$, $T_2$ of a triac 20 are connected in series with the load 25 to be supplied between a pair of input terminals (A,B) adapted to be connected to a signal source having a polarity that varies with time. Typically, though not exclusively, the signal source will be sinusoidal ac source 30, as shown in FIG. 2. The CA3059, shown circumscribed in phantom, is connected in circuit in the manner shown between the pair of input terminals (A,B) and the gate electrode (G) of the triac 20. Alternately, the CA3059 may be indirectly coupled to the gate electrode (G) of the triac; e.g. through a pulse transformer. Power to the CA3059 may be derived via input terminals A and B, as shown in FIG. 2, or from an external dc power supply (not shown) connected between terminals 2 and 7. In the normal mode of operation, a dropping resistor 32 is required to limit the current in the IC, the selection of resistor 32 being a function of the average current drawn from the power supply 30. Moreover, since most zero-voltage switches provide current pulses of a single polarity to the gate electrode of the triac being controlled, e.g. positive pulses in the case of the CA3059, triac selection should be made based upon operation in either the positive [i.e. I(+) and III(+)] or negative [i.e. I(−) and III (−)] gating modes.

Basically, the limiter stage 40 of the CA3059 clips the incoming AC line voltage to approximately ±8 volts. This signal is then applied to the zero-voltage-crossing (ZVC) detector 42, which generates an output pulse during each passage of the line voltage through zero. The limiter output is also applied to a rectifying diode and an external capacitor 34 which together comprise a dc power supply 44. The power supply 44 provides approximately 6 volts as a $V_{cc}$ supply to the other stages of the IC. The on/off sensing amplifier 46 is basically a differential comparator and includes, among other terminals, a pulse ensuring terminal 13 and a pulse inhibiting terminal 9. The triac gating circuit 48 contains a driver for direct triac triggering. The gating circuit is enabled when all the inputs are at a high voltage: i.e. line voltage 30 must be approximately 0 volts; the sensing amplifier 46 output must be high; external voltage to terminal 1 must be a logical "0" which in turn is then inverted and transmitted to gating circuit 48 as a "high" input by inverter 43; and the output of the fail-safe circuit 50 must be "high".

Figure 3:
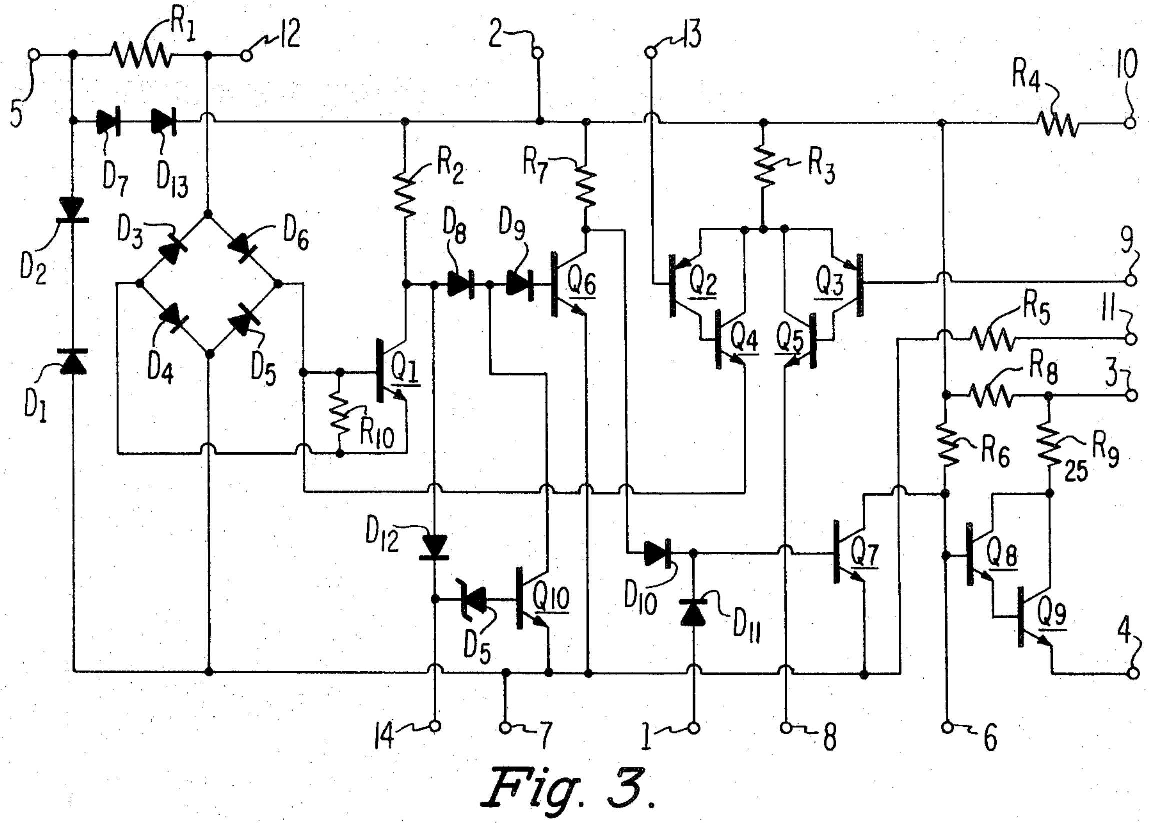
FIG. 3 is a circuit diagram of the RCA–CA3059.

With reference to FIG. 3, which is a circuit schematic of the CA3059, diodes $D_1$ and $D_2$ form a symmetrical clamp which limits the voltages on the chip to ±8 volts, as discussed supra. Diodes $D_7$ and $D_{13}$ form a half wave rectifier which develops a positive voltage on the external storage capacitor 34 shown in FIG. 2.

With the CA3059 in the "ON" state (i.e. providing a gating signal to the gate electrode G of the triac 20 via terminal 4) $Q_8$ and $Q_9$ are conducting, $Q_7$ is off and $Q_6$ is on. Any action that turns $Q_7$ on removes the drive from $Q_8$ and allows the thyristor to turn off. $Q_7$ may be turned on directly by application of a minimum of +1.2 volts at 10 microamperes to terminal 1 which is an external inhibit terminal. If a voltage of more than 2 volts is available, external resistance must be added to limit the current to 10 milliamperes. Diode $D_{10}$ isolates the base of $Q_7$ from other signals when an external inhibit signal is applied so that this signal is the highest priority command for normal operation. $Q_7$ may also be activated by turning off $Q_6$ to allow current to flow from the power supply through $R_7$ and $D_{10}$ to the base. $Q_6$ is normally held on by current flowing into its base through $R_2$, $D_8$ and $D_9$, when $Q_1$ is off.

$Q_1$ is a portion of the zero-crossing detector 42. When the voltage at terminal 5 is greater than +3 volts, current can flow through $R_1$, $D_6$, the base-to-emitter junction of $Q_1$ and $D_4$, to terminal 7 to turn on $Q_1$ and inhibit the pulse. For negative voltages with magnitudes greater than 3 volts, the current flows through $D_5$, the emitter-to-base junction of $Q_1$, $D_3$ and $R_1$, and again turns $Q_1$ on. $Q_1$ is off only when the voltage at terminal 5 is less than the threshold voltage of approximately 2 volts.

The on/off sensing amplifier 46 comprising transistors $Q_2$, $Q_3$, $Q_4$ and $Q_5$ makes the CA3059 a flexible power control circuit. The transistor pairs $Q_2$–$Q_4$ and $Q_3$–$Q_5$ form high-beta composite PNP transistors in which the emitters of $Q_4$ and $Q_5$ act as the collectors of the composite devices. These two composite transistors are connected as a differential amplifier with $R_3$ acting as a constant current source. The relative current flow in the two "collectors" is a function of the difference in voltage between the bases of $Q_2$ and $Q_3$. Therefore, when terminal 13 is more positive than terminal 9, little or no current flows in the "collector" of $Q_2$–$Q_4$; when terminal 13 is negative with respect to terminal 9, most of the current flows through that path and none in terminal 8. When current flows in $Q_2$–$Q_4$, the path is from the supply through $R_3$ through $Q_2$–$Q_4$, through the base-to-emitter junction of $Q_1$ and finally through $D_4$ to terminal 7. Therefore, when $V_{13}$ is more negative than $V_9$, $Q_1$ is on and output is inhibited.

In the temperature control circuit shown in FIG. 2, the voltage at terminal 9 of the CA3059 is derived from the supply by connection of terminal 10 and 11 to form a precision voltage divider. This divider forms one side of a transducer bridge, with resistor 52 and a negative temperature coefficient (NTC) sensor 54 forming the other. At low temperatures, the large value of the sensor 54 causes terminal 13 to be positive with respect to terminal 9 so that the thyristor fires on every half cycle and power is applied to the load 25. As the temperature increases, the sensor resistance decreases until a balance is reached and $V_{13}$ approaches $V_9$. At this point, $Q_2$–$Q_4$ begins to turn on and inhibit further pulses. The control temperature is adjusted by variation of the value of resistor 52. For cooling service, either the positions of resistor 52 and the sensor 54 may be reversed, or terminals 9 and 13 may be interchanged.

Figure 4:
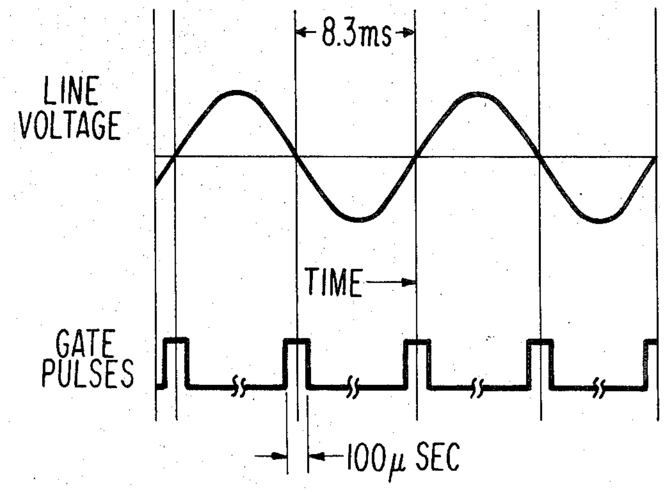
FIGS. 4–6 are a series of waveforms helpful in understanding the present invention.

FIG. 4 illustrates the position and width of the pulses supplied to the gate of the thyristor by the CA3059 with respect to an incoming 60 cycle ac line voltage. Under normal operating conditions, the CA3059 can supply sufficient gate voltage and current to trigger most thyristors at ambient temperatures of 25°C. However, under worst case conditions, selection of higher current thyristors may be necessary for particular applications.

Figure 5:
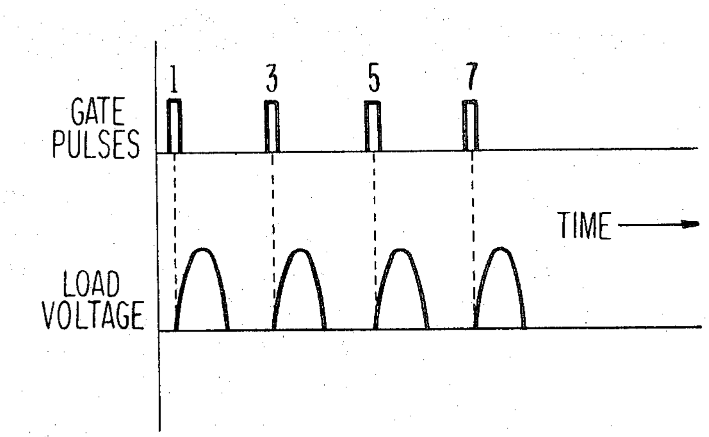

The method by which the CA3059 senses the zero crossing of the ac power can result in a "half-cycling" phenomenon at the control point. FIG. 5 illustrates this phenomenon. As discussed supra, the CA3059 senses the zero voltage crossing every half cycle and an output, for example pulse number 1 as shown in FIG. 5, is produced to indicate the zero crossing. During the subsequent 8.3 milliseconds, however, should the voltage at the input terminals 9, 13 of the sensing amplifier within the CA3059 be approximately equal, the amplifier may change state, thereby inhibiting any further output pulses.

This "unstable region" of the differential amplifier may prevent the generation of a second pulse. In the absence thereof the triac is prevented from triggering during the subsequent negative excursion of the ac line voltage as shown in FIG. 5. Although solutions exist for the elimination of this half cycling phenomenon, they are generally elaborate in nature and/or involve the addition of some hysteresis to the circuit which may, in some instances, be undesirable. For a further discussion of these solutions, the reader is referred to the forementioned RCA application notes.

In accordance with the present invention, means are connected in circuit with the gate electrode of the triac being controlled to provide a representation of the signal appearing at main terminal electrode $T_2$ to either a pulse-ensuring or pulse-preventing point within the zero-voltage switch. As shown in FIG. 2, such means comprises a capacitor 60 connected between the gate electrode (G) of triac 20 and terminal 9 of the CA3059. In practice a 0.001 microfarad capacitor has been satisfactorily used. Alternately, it might be desirable to use a high quality operational amplifier to provide this differentiating function.

As discussed supra, assuming the line voltage to be at approximately zero volts, the external voltage to terminal 1 a logical "0", and the output of the fail-safe circuit "high", the sensing amplifier output will be "high" and current pulses will be provided to the gate electrode of the triac via terminal 4 of the zero-voltage switch if the potential at terminal 13 substantially exceeds the potential at terminal 9. Conversely, assuming the same conditions, no triggering pulses will be delivered when the potential at terminal 9 substantially exceeds the potential at terminal 13. Where the potential at terminals 9 and 13 are approximately equal, the sensing amplifier 46 may or may not switch or remain in its high output state depending on its sensitivity and inherent "hysteresis". Moreover, any ripple reflected on the dc power supply from the ac line when the sensing amplifier is in this unstable region may tend to coax the amplifier into a "high" or "low" state depending on the polarity of the applied ac half cycle. Generally, this results in triac conduction only during positive or negative half cycles (i.e. half-cycling), as shown in FIG. 5.

Figure 6:
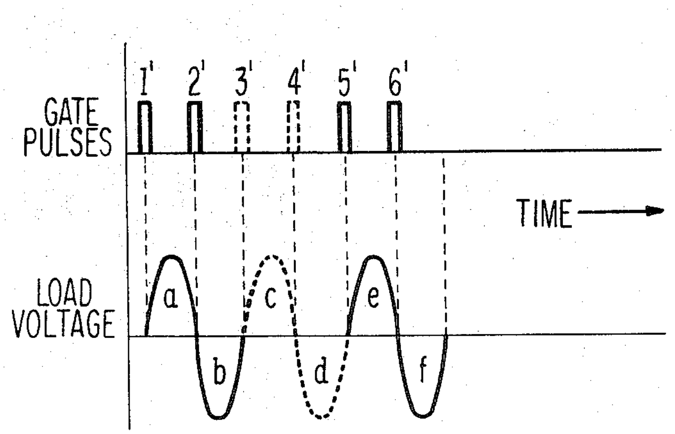

Assuming the presence of capacitor 60, as shown in FIG. 2, when the triac has been pulsed on in the I(+) mode (i.e. during positive half cycle "a" of applied ac as shown in FIG. 6) conventional current flows from $T_2$-to-$T_1$ and a "positive" voltage is reflected to the gate electrode (G) of the triac with reference to $T_1$. This is due to the shorted-emitter construction of most triacs presently on the market which results in a reflection of the current flowing through the main terminal electrodes of the triac to the gate electrode in the form of a voltage which resembles the current waveshape as clipped by the semiconductor junctions of the gate. Stated alternately, the gate electrode may, in the usual case, be viewed as a non-linear current sampling resistor for the triac load current. As the load current flowing through the triac 20 approaches zero, the voltage on the gate electrode (G) begins to decrease. The rate of change of voltage with respect to time ($dv/dt$) across capacitor 60 causes a "negative" current ($i = C\ dv/dt$) to be induced which flows into terminal 9. The presence of this "negative" current at terminal 9 tends to reduce its potential with respect to terminal 13, thereby coaxing the sensing amplifier 46 to remain in its "high" state so that a gating pulse 2', as shown in FIG. 6, is provided to the triac at the beginning of the subsequent half-cycle (i.e. negative half cycle "b") causing the triac to conduct in a III(+) mode (i.e. with conventional current flowing from $T_1$-to-$T_2$). With the triac conducting in the III(+) mode, a "negative" voltage is reflected to the gate electrode (G) of the triac with reference to $T_1$. As the load current through the triac climbs toward zero it causes this "negative" voltage on the gate to also climb toward zero. The rate of change of this "negative" voltage with respect to time causes a "positive" current to be induced in the capacitor ($i = c\ dv/dt$) which flows into terminal 9. This "positive" current tends to increase the potential at terminal 9 with respect to terminal 13 thereby coaxing the amplifier switch off and preventing the transmission of a gating signal (shown in phantom as 3') to the triac thereby inhibiting conduction during the subsequent positive half-cycle (shown in phantom as "c"). Non-conduction during negative half cycle "d" is assured due to a phase shift in voltage between terminals 9 and 13 resulting from capacitor 60 which tends to bias terminal 9 slightly positive with respect to terminal 13 at the beginning thereof. However, at the beginning of the next positive half cycle "e", the relative polarities of terminals 9 and 13 are reversed causing the differential amplifier to switch into its "high" state thereby causing a triggering pulse 5' to be supplied to the triac to initiate conduction for the remaining portion thereof; i.e. the triac will attempt to revert back to its normal "positive half cycling" mode of operation. Accordingly, it will be seen that inclusion of differentiating capacitor 60 has resulted in the elimination of the "half cycling" effect in favor of alternate integral-cycle (i.e. a–b, e–f) operation, thereby resulting in the elimination of undesirable dc components on the line.

The foregoing description is applicable to the operation of a circuit in a normal environment using a shorted-emitter triac having a normal gate impedance (e.g. RCA's 40721 triac). Where the circuit is operated in an electrically noisy environment, or where a triac having a higher than normal gate impedance is used (e.g. a "sensitive gate" triac such as RCA's 40529) it may be desirable to insert a shunting resistor 65 between the gate electrode G and terminal $T_1$ of the triac, as shown in FIG. 2. This resistor will tend to lower the effective impedance between $T_1$ and the gate electrode of the triac thereby insuring the inducement of a sufficient current in capacitor 60. Typically, a 100 ohm resistor has been found suitable for this purpose.

What is claimed is:

1. In a switching circuit for controlling the supply of power to a load from an alternating current source, said circuit comprising a thyristor having first and second main electrodes and a gate electrode; and switching means including a comparison circuit having a pulse-ensuring and a pulse-inhibiting terminal, wherein said switching means under normal operation provides a triggering signal to the gate electrode of said thyristor when the potential at said pulse-ensuring terminal substantially exceeds the potential of said pulse-inhibiting terminal, and prevents the provision of such signal when the potential at said pulse-inhibiting terminal substantially exceeds the potential at said pulse-ensuring terminal, the operation of said switching means being unstable during periods when the potential at said pulse-ensuring and pulse-inhibiting terminals are approximately equal, said instability resulting in the unsymmetrical supply of ac half-cycles to the load during such periods, the improvement comprising means responsive to the conduction state of said thyristor during a given half-cycle of ac operation for providing a signal to one of said terminals, said signal operating during such periods of unstable operation to permit or prevent the application of a triggering signal to the gate electrode of said thyristor during the subsequent half cycle of applied ac thereby causing said thyristor to conduct for an integral number of ac cycles during such periods.

2. The invention in accordance with claim 1 wherein said improvement comprises differentiating means connected in circuit with the gate electrode of said thyristor and a given one of said terminals of said comparison circuit, said differentiating means being responsive to the rate of change of potential at said gate electrode.

3. The invention in accordance with claim 2 wherein said differentiating means comprises a capacitive element.

4. A switching circuit for controlling the supply of power to a load from an alternating current source comprising:

a thyristor having first and second main electrodes and a gate electrode;

switching means connected in circuit with said thyristor electrodes;

said switching means comprising a threshold detector, a comparison circuit haivng a pulse-ensuring terminal and a pulse-inhibiting terminal, and an output circuit, said switching means providing a triggering signal to the gate electrode of said thyristor via said output circuit when said threshold detector is in a given condition and when the potential of said pulse-ensuring terminal substantially exceeds the potential at said pulse-inhibiting terminal; and differentiating means responsive to the conduction state of said thyristor during a given half-cycle of ac operation when the potential at said pulse-ensuring and pulse-inhibiting terminals are not substantially different, said differentiating means providing a signal to one of said terminals of said comparison circuit, said signal operating to permit or prevent the transmission of a triggering signal to said gate electrode from said output circuit during the subsequent half-cycle of ac operation to cause said thyristor to conduct for an integral number of ac cycles when the potential at said pulse-ensuring and pulse-inhibiting terminals are not substantially different.

5. A switching circuit as defined in claim 4 further comprising sampling means for providing a signal to said differentiating means which is a reflection of the load current flowing through the main terminal electrodes of said thyristor.

6. A switching circuit as defined in claim 5 wherein said differentiating means is connected in circuit between the gate electrode of said thyristor and a given one of said terminals of said comparison circuit.

7. A switching circuit as defined in claim 6 wherein said differentiating means is responsive to the rate of change of potential at said gate electrode.

8. A switching circuit as defined in claim 7 wherein said differentiating means comprises a capacitive element.

9. In combination:

a pair of input terminals to which an alternating operating voltage may be applied;

a thyristor having two main electrodes and a gate electrode, the two main electrodes connected to said two input terminals, respectively;

a gate pulse producing circuit, coupled to said terminals, for producing an output pulse each half cycle of said alternating operating voltage;

circuit means responsive to a control signal of greater by at least a given relatively small amount than a given value for applying a gate pulse produced by said gate pulse producing circuit to said gate electrode and responsive to said control signal when it is less by at least a given relatively small amount than said given value for preventing said gate pulse producing means for applying a pulse to said gate electrode; and means coupled to said thyristor and responsive to the rate of change of current flow therethrough for maintaining said circuit means enabled when, during the first half cycle of said alternating voltage said control signal is at or close to said given value, whereby one complete cycle of said alternating current flows through said thyristor and for disabling said circuit means when, during the second half cycle of said alternating current flow through said thyristor, said control signal is at or close to said given value, whereby substantially no alternating current flows through said thyristor for the following complete cycle.

10. In the combination as set forth in claim 9, said circuit means including a differential amplifier connected to receive at one input terminal said control signal and at its other input terminal both a reference voltage level and a signal produced in response to said rate of change of said current.

11. In the combination as set forth in claim 10, said means coupled to said thyristor comprising a capacitor connected to said gate electrode and a relatively high impedance coupling between said gate electrode and one of said main electrodes.

* * * * *